(12) United States Patent
Low et al.

(10) Patent No.: US 12,381,031 B2
(45) Date of Patent: Aug. 5, 2025

(54) CONTINUOUS FOLDING PLANAR TRANSFORMER WINDING

(71) Applicant: Enphase Energy, Inc., Petaluma, CA (US)

(72) Inventors: Tyrone David Low, Christchurch (NZ); Phillip Mark Hunter, Prebbleton (NZ); Rian van der Colff, Christchurch (NZ)

(73) Assignee: Enphase Energy, Inc., Petaluma, CA (US)

( * ) Notice: Subject to any disclaimer, the term of this patent is extended or adjusted under 35 U.S.C. 154(b) by 872 days.

(21) Appl. No.: 17/577,902

(22) Filed: Jan. 18, 2022

(65) Prior Publication Data
US 2022/0270814 A1   Aug. 25, 2022

Related U.S. Application Data

(60) Provisional application No. 63/151,255, filed on Feb. 19, 2021.

(51) Int. Cl.
*H01F 27/30* (2006.01)
*H01F 27/28* (2006.01)
(Continued)

(52) U.S. Cl.
CPC ....... *H01F 27/306* (2013.01); *H01F 27/2804* (2013.01); *H05K 1/189* (2013.01); *H01F 2027/2819* (2013.01); *H05K 1/165* (2013.01)

(58) Field of Classification Search
CPC ............... H01F 27/306; H01F 27/2804; H01F 2027/2819
(Continued)

(56) References Cited

U.S. PATENT DOCUMENTS 2,943,966 A * 7/1960 Leno ............... H01F 17/0006
29/609.1
4,959,630 A   9/1990 Yerman et al.
(Continued)

FOREIGN PATENT DOCUMENTS

CN   111883345 A   11/2020
JP   2003188026   7/2003
WO   WO-0133582 A1   5/2001

OTHER PUBLICATIONS

Yue Quan Hu, D. K. -W. Cheng and Yim-Shu Lee, "New fabrication method for planar multilayer windings used in low-profile magnetic components," in IEEE Transactions on Magnetics, vol. 35, No. 2, pp. 1055-1059, Mar. 1999, doi: 10.1109/20.748853.
(Continued)

*Primary Examiner* — Shawki S Ismail
*Assistant Examiner* — Joselito S. Baisa
(74) *Attorney, Agent, or Firm* — Moser Taboada

(57) ABSTRACT

Embodiments of planar transformer winding assemblies are provided herein. For example, a transformer winding assembly comprises a primary winding configured to connect to an upper surface of a flexible substrate comprising a plurality of conjoined annular rings, the primary winding runs along the plurality of conjoined annular rings in a first configuration and a secondary winding configured to connect to a lower surface of the flexible substrate, the secondary winding runs along the plurality of conjoined annular rings in a second configuration different from the first configuration.

20 Claims, 5 Drawing Sheets

(51) Int. Cl.
*H05K 1/16* (2006.01)
*H05K 1/18* (2006.01)

(58) Field of Classification Search
USPC ............................................... 336/200
See application file for complete search history.

(56) References Cited

U.S. PATENT DOCUMENTS

| | | | |
|---|---|---|---|
| 5,017,902 A | 5/1991 | Yerman et al. | |
| 5,084,958 A * | 2/1992 | Yerman | H01F 27/2804 |
| | | | 336/200 |
| 5,134,770 A * | 8/1992 | Yerman | H01F 17/0006 |
| | | | 336/200 |
| 5,175,525 A * | 12/1992 | Smith | H01F 27/2866 |
| | | | 336/83 |
| 5,276,421 A * | 1/1994 | Boitard | H01F 27/2804 |
| | | | 336/200 |
| 6,222,437 B1 | 4/2001 | Soto et al. | |
| 7,178,220 B2 | 2/2007 | Harding | |
| 7,859,382 B2 * | 12/2010 | Koprivnak | H01F 30/04 |
| | | | 336/200 |
| 7,911,309 B2 * | 3/2011 | Tsai | H01F 27/2847 |
| | | | 336/200 |
| 7,965,166 B2 * | 6/2011 | Okawa | H01F 27/2804 |
| | | | 336/200 |
| 2003/0016112 A1 * | 1/2003 | Brocchi | H01F 27/2847 |
| | | | 336/200 |
| 2004/0075525 A1 | 4/2004 | Sippola et al. | |
| 2005/0140487 A1 | 6/2005 | Sippola et al. | |
| 2007/0229206 A1 | 10/2007 | Kit et al. | |
| 2011/0050381 A1 | 3/2011 | Olson | |
| 2014/0085031 A1 | 3/2014 | Nomura et al. | |
| 2018/0268986 A1 * | 9/2018 | Marchese | H01F 27/2885 |

OTHER PUBLICATIONS

P. Zumel, R. Prieto, J. A. Cobos and J. Uceda, "Comparative study of flex-foil technology in HF planar transformer windings," 2002 IEEE 33rd Annual IEEE Power Electronics Specialists Conference. Proceedings (Cat. No. 02CH37289), 2002, pp. 1248-1253 vol. 3, doi: 10.1109/PSEC.2002.1022348.

E. C. W. de Jong, J. A. Ferreira and P. Bauer, "Integrated flex winding realization for 3D PCB converters," 2006 37th IEEE Power Electronics Specialists Conference, 2006, pp. 1-7, doi: 10.1109/pesc.2006.1712207.

International Search Report and Written Opinion for application No. PCT/US2022/012718, dated Apr. 28, 2022.

* cited by examiner 2 turn primary 3 turn primary 4 turn primary

CONTINUOUS FOLDING PLANAR TRANSFORMER WINDING

CROSS-REFERENCE TO RELATED APPLICATIONS

The present application claims the benefit of and priority to U.S. Provisional Application Ser. No. 63/151,255, filed on Feb. 19, 2021, the entire contents of which is incorporated herein by reference.

BACKGROUND

Field of the Disclosure

Embodiments of the present disclosure relate generally to transformer windings and, more particularly, to foldable planar transformer windings.

Description of the Related Art

Planar transformers are well-known in the art and provide advantages over traditional wire-wound transformers such as high-power density at a lower volume and weight. However, such transformers also have several disadvantages. For example, traditional wire-wound transformers are typically designed to use multiple turn windings for both the primary and secondary windings in order to allow the core size to be reduced. Additionally, multiple windings are challenging for planar transformers as they require layer-to-layer vias or stacking multiple separate PCBs which then need to be physically interconnected. Such techniques result in increased costs as well as reliability issues.

Therefore, there is a need in the art for improved planar transformer windings.

SUMMARY

Embodiments of the present disclosure generally relate to a planar transformer winding assembly. For example, a transformer winding assembly comprises a primary winding configured to connect to an upper surface of a flexible substrate comprising a plurality of conjoined annular rings, the primary winding runs along the plurality of conjoined annular rings in a first configuration; and a secondary winding configured to connect to a lower surface of the flexible substrate, the secondary winding runs along the plurality of conjoined annular rings in a second configuration different from the first configuration.

In accordance with at least some embodiments, a flexible substrate comprises a plurality of conjoined annular rings, an upper surface, a lower surface, and a plurality of fold lines configured to allow the flexible substrate to be folded therealong and transformer winding assembly comprising a primary winding connected to the upper surface and running along the plurality of conjoined annular rings in a first configuration and a secondary winding connected to the lower surface and running along the plurality of conjoined annular rings in a second configuration different from the first configuration.

In accordance with at least some embodiments, a system for power conversion comprises a power converter comprising a flexible substrate comprising a plurality of conjoined annular rings, an upper surface, a lower surface, and a plurality of fold lines configured to allow the flexible substrate to be folded therealong and a transformer winding assembly comprising a primary winding connected to the upper surface and running along the plurality of conjoined annular rings in a first configuration, a secondary winding connected to the lower surface and running along the plurality of conjoined annular rings in a second configuration different from the first configuration and a controller communicatively connected to the power converter for providing operative control of the power converter during power conversion.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to a planar transformer winding assembly comprising a thin, flexible, non-conductive substrate, a layer of conductive material applied to the upper surface of the substrate, and a layer of conductive material applied to the lower surface of the substrate. The substrate is sized and shaped such that it can be folded in a particular folding pattern to fit with a corresponding planar transformer core, and the layers of conductive material are configured such that the folded assembly is a multilayer winding assembly formed from a single continuous structure and thus negating the need for conductive vias or separate connections between layers.

In some embodiments, the transformer winding assembly comprises a non-conductive flexible substrate, such as a flexible circuit board (FCB), having applied thereon two layers of conductive material (i.e., primary and secondary windings), which are separated by the necessary safety insulation. The overall shape of the expanded (i.e., unfolded) winding assembly is in multiples of two of the final required winding shape, and the primary and secondary windings are configured in a pattern which, when folded, provides a complete and compact transformer winding assembly having perfectly interleaved primary and secondary windings.

The designs and folding patterns described herein allow for perfectly interleaved primary and secondary traces, with easily configurable shapes, sizes and turns ratios. As a result of the folding pattern of the winding assembly, only functional insulation may be required on the outer layers (i.e., to insulate secondary to secondary, or primary to primary).

Further, the designs and techniques described herein negate the need for layer-to-layer vias, and also allow for multiple configurations in the same footprint.

Figure 1:
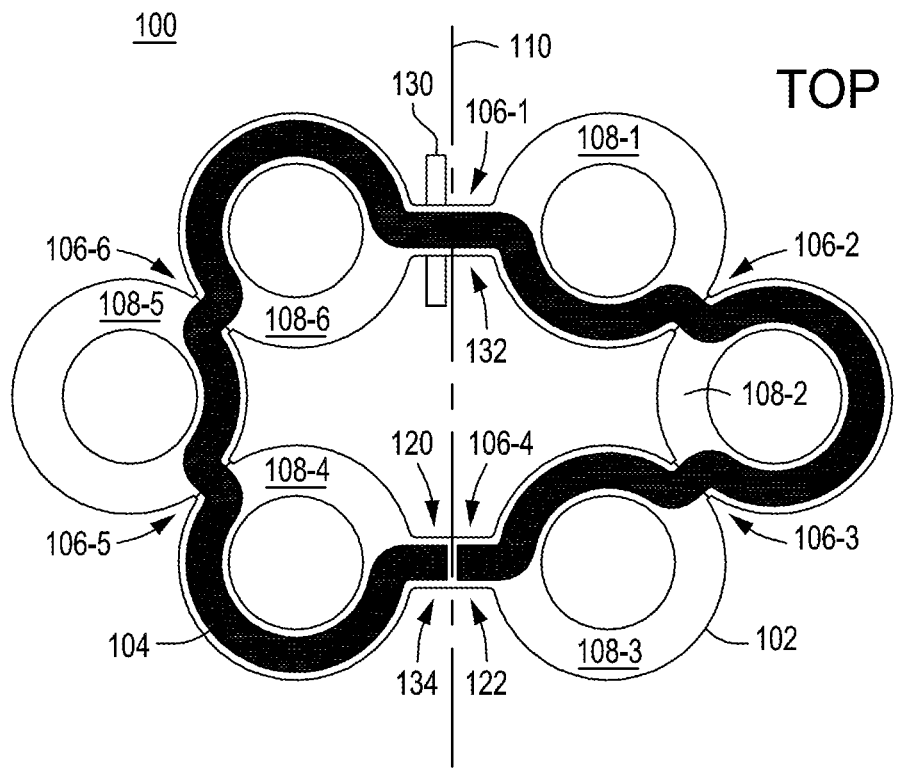
FIG. 1 is a plan view of an expanded continuous folding planar transformer winding assembly in accordance with one or more embodiments of the present disclosure.

FIG. 1 is a plan view of a winding assembly (e.g., an expanded continuous folding planar transformer) 100 in accordance with one or more embodiments of the present disclosure.

The continuous folding planar transformer winding assembly 100, referred to herein as winding assembly 100, comprises a primary winding 104 that is configured to be applied to an upper surface (which also may be referred to herein as a top side) of a flexible circuit board (FCB) 102 (foldable). The FCB 102, which in other embodiments may be any suitable flexible substrate, is formed in the shape of a plurality of conjoined annular rings 108-1-108-6 (collectively referred to as rings 108), each of the rings 108 having the same diameter as well as the same sized center hole. The rings 108 are sized (ring diameter and center hole diameter) such that the folded winding assembly 100 may be configured for use with a corresponding planar transformer core having a cylindrical center post.

The ring 108-2 (e.g., second annular ring) is conjoined with the rings 108-1 and 108-3 (e.g., a first annular ring and a third annular ring) along fold lines 106-2 and 106-3 (e.g., a first fold line and a third fold line), respectively, and the ring 108-5 (e.g., a fifth annular ring) is conjoined with the rings 108-4 and 108-6 (e.g., fourth annular ring and a sixth annular ring) along fold lines 106-5 and 106-6 (e.g., a fifth fold line and a six fold line), respectively. The rings 108-1 and 108-6 are joined by a strip 132 (e.g., a first strip), and a pair of tabs 130 extend perpendicularly along the same plane as the strip 132, the tabs 130 extending 180° from one another. The rings 108-3 and 108-4 are joined by strip 134 (e.g., a second strip). Fold lines 106-1 and 106-4 (e.g., a first fold line and a fourth fold line) run along a vertical axis 110 through the center of the strips 132 and 134, respectively, where the vertical axis 110 is along the same plane as the FCB 102.

In the embodiment described with respect to FIG. 1, the fully-folded winding assembly 100 is a 3:15 circular winding. In other embodiments, the number of turns for the primary and/or the secondary windings may differ; in some alternative embodiments, only one winding may be present. The primary winding 104 is formed from a continuous conductive film, such as a copper foil, having uniform thickness and width (although in some alternative embodiments the thickness and/or width may vary, and/or the film may not be continuous). A first end of the primary winding 104 (which may also be referred to as a first terminal of the primary winding 104) is applied to the strip 134 adjacent to the fold line 106-4 and on the side of the vertical axis 110 in which the ring 108-4 resides (primary winding start 120). The primary winding 104 runs continuously along the upper surface of the FCB 102, running alternately in a clockwise/counter-clockwise direction along a portion each ring 108.

As depicted in FIG. 1, the primary winding 104 runs from its first terminal toward the ring 108-4 and along a clockwise direction around the primary winding 104 until reaching the fold line 106-5, where it crosses over to the ring 108-5. The primary winding continues along a counter-clockwise direction of the ring 108-5 until it reaches the fold line 106-6, where it crosses over to the ring 108-6 and runs along the ring 108-6 in a clockwise direction until it reaches the strip 132. The primary winding 104 continues along the strip 132 and over the fold line 106-1 toward the ring 108-1, where it runs along the ring 108-1 in a counter-clockwise direction until reaching the fold line 106-2. At the fold line 106-2, the primary winding 104 crosses to the ring 108-2 and moves in a clockwise direction along the ring 108-2 until reaching the fold line 106-3, where it crosses to the ring 108-3. The primary winding 104 continues along the ring 108-3 in a counter-clockwise direction until reaching the strip 134. The primary winding 104 runs along the strip 134, terminating at a second end of the primary winding 104 (which may also be referred to as a second terminal of the primary winding 104) before reaching the fold line 106-4 (primary winding finish 122).

Figure 2:
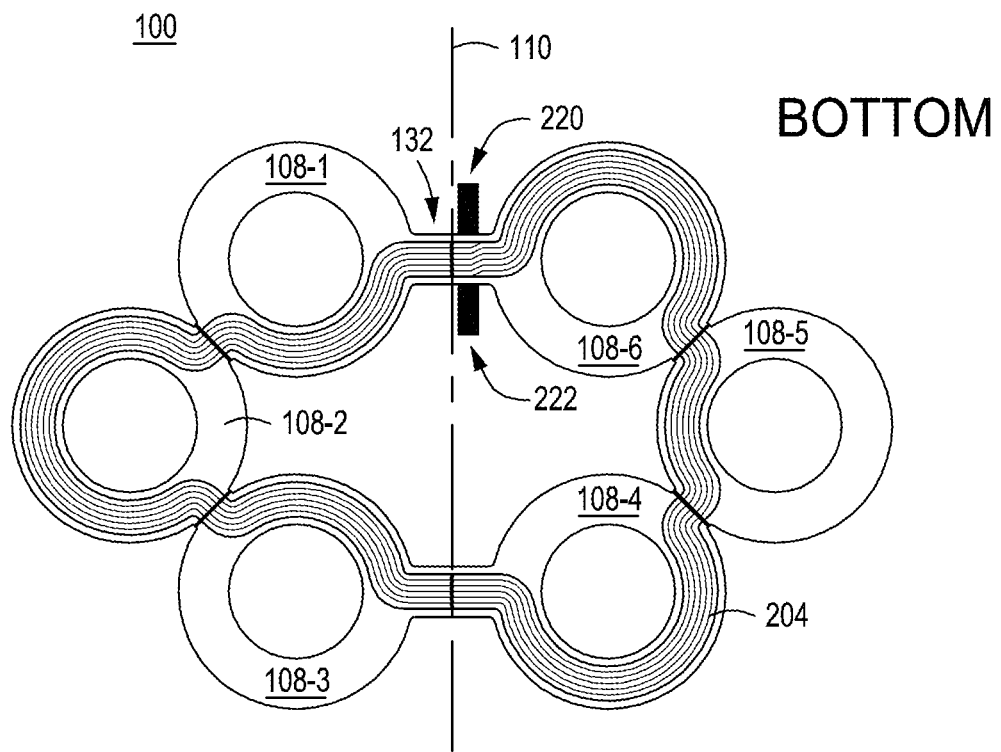
FIG. 2 is a view of the lower surface of the expanded winding assembly in accordance with one or more embodiments of the present disclosure.

FIG. 2 is a view of the lower surface of the expanded winding assembly 100 in accordance with one or more embodiments of the present disclosure. In the view depicted in FIG. 2, the winding assembly 100 shown in FIG. 1 has been rotated 180° around the vertical axis 110. A secondary winding 204 is formed from a continuous trace of conductive material (a continuous conductive trace), such as a copper trace, having uniform thickness and width (although in some alternative embodiments the thickness and/or width may vary, and/or the trace may not be continuous). A first end of the secondary winding 204 (which may be referred to as a first terminal of the secondary winding 204) is applied to the strip 132 where one of the tabs 130 extends outwardly from the strip 132 (secondary winding start 220).

The secondary winding 204 runs continuously along the FCB 102 lower surface, traversing each of the rings 108 multiple times to create five parallel traces. A second end of the secondary winding 204 (which may be referred to as a second terminal of the secondary winding 204) terminates on the strip 132 where one of the tabs 130 extends inwardly from the strip 132 (secondary winding finish 222). The parallel traces of the secondary winding run alternately in a clockwise/counter-clockwise direction along a portion of each ring 108 such that the secondary winding 204 runs underneath the primary winding 104, separated by the FCB 102.

FIGS. 3a-3d depict folding steps for the winding assembly 100 in accordance with one or more embodiments of the present disclosure. The primary winding 104 and the secondary winding 204 applied to the FCB 102 and configured as described above form a single flexible circuit that, when folded in the particular manner described herein, results in a multiturn, multilayer transformer winding assembly.

Figure 3A:
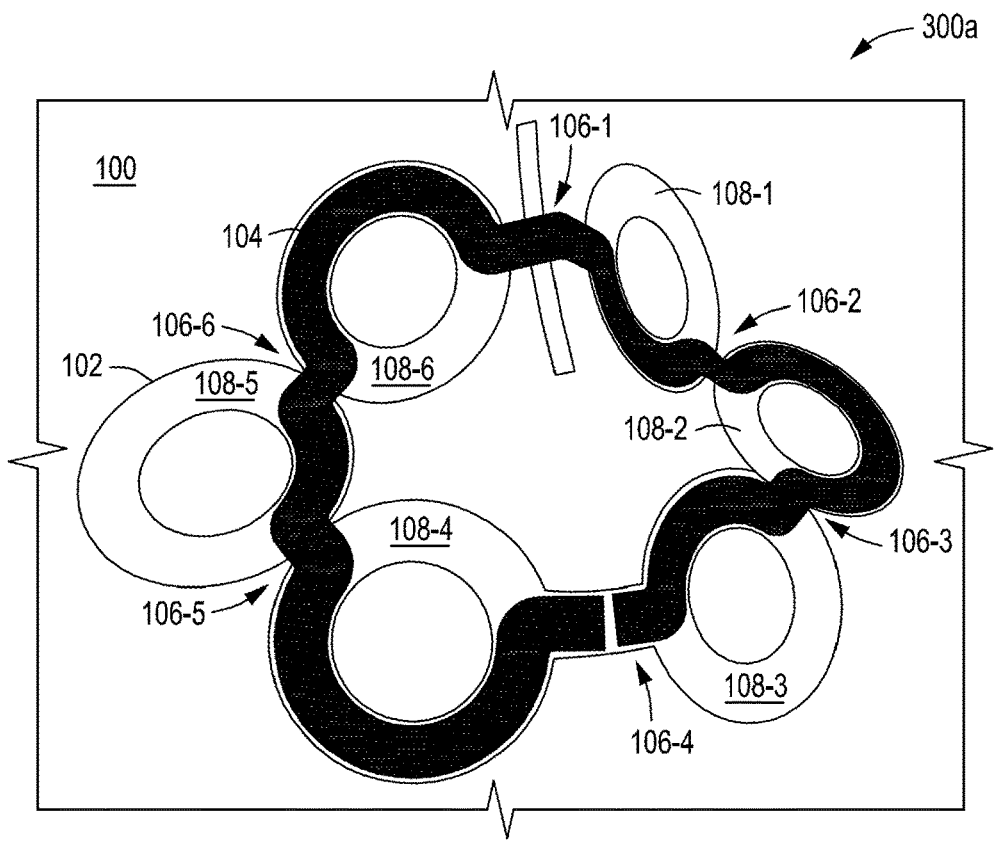
FIGS. 3a-3d depict folding steps for the winding assembly in accordance with one or more embodiments of the present disclosure.

FIG. 3a depicts a top perspective view 300a of the winding assembly 100 with initial folds. The winding assembly 100 is folded back toward itself in an origami-style mountain fold along fold lines 106-1 and 106-4. The rings 108-1, 108-2, and 108-3 are folded in a compound fold, where the rings 108-1 and 108-2 are folded in an origami-style valley fold along the fold line 106-2, and the rings 108-2 and 108-3 are folded in a mountain fold along the fold line 106-3. The rings 108-4, 108-5, and 108-6 are analogously folded in a compound fold, where the rings 108-4 and 108-5 are folded in a mountain fold along the fold line 106-5, and the rings 108-5 and 108-6 are folded in a valley fold along the fold line 106-6.

Figure 3B:
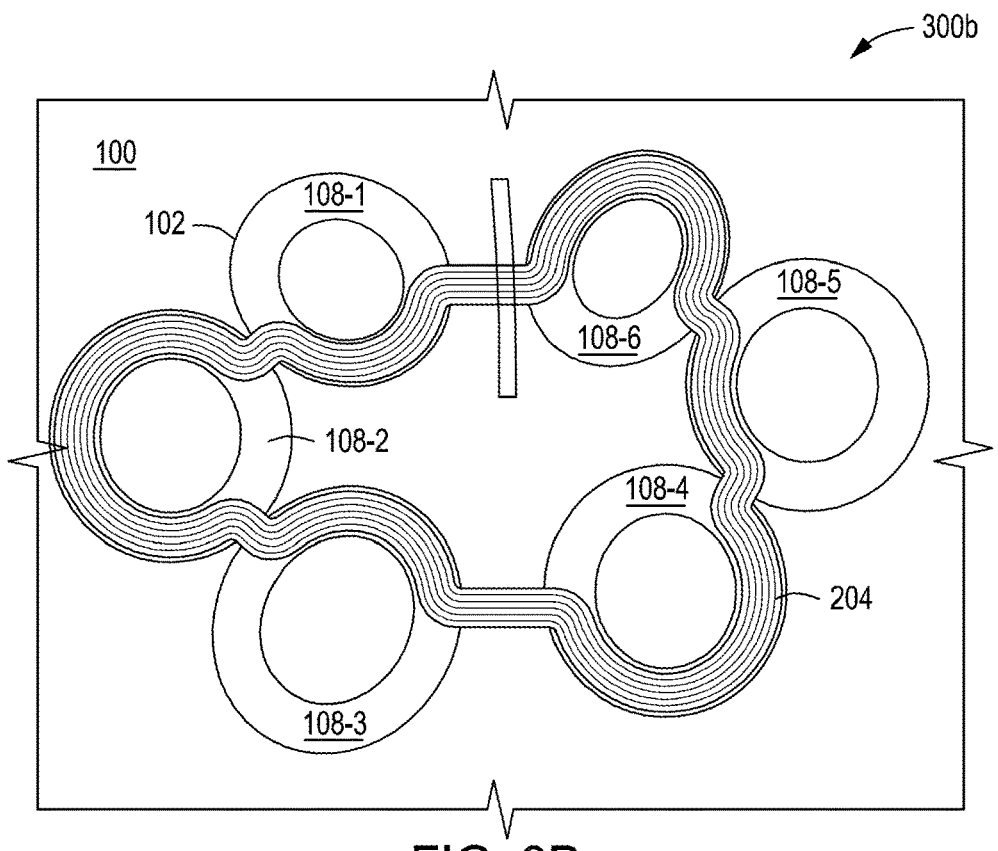
Figure 3C:
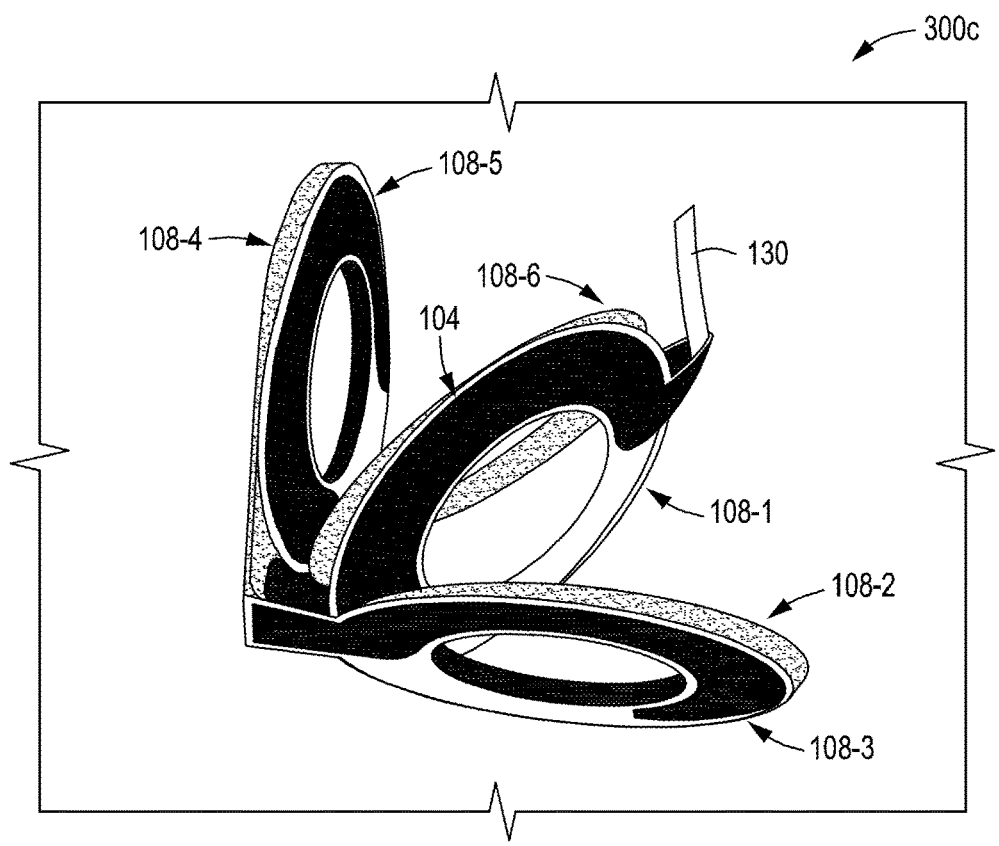
Figure 3D:
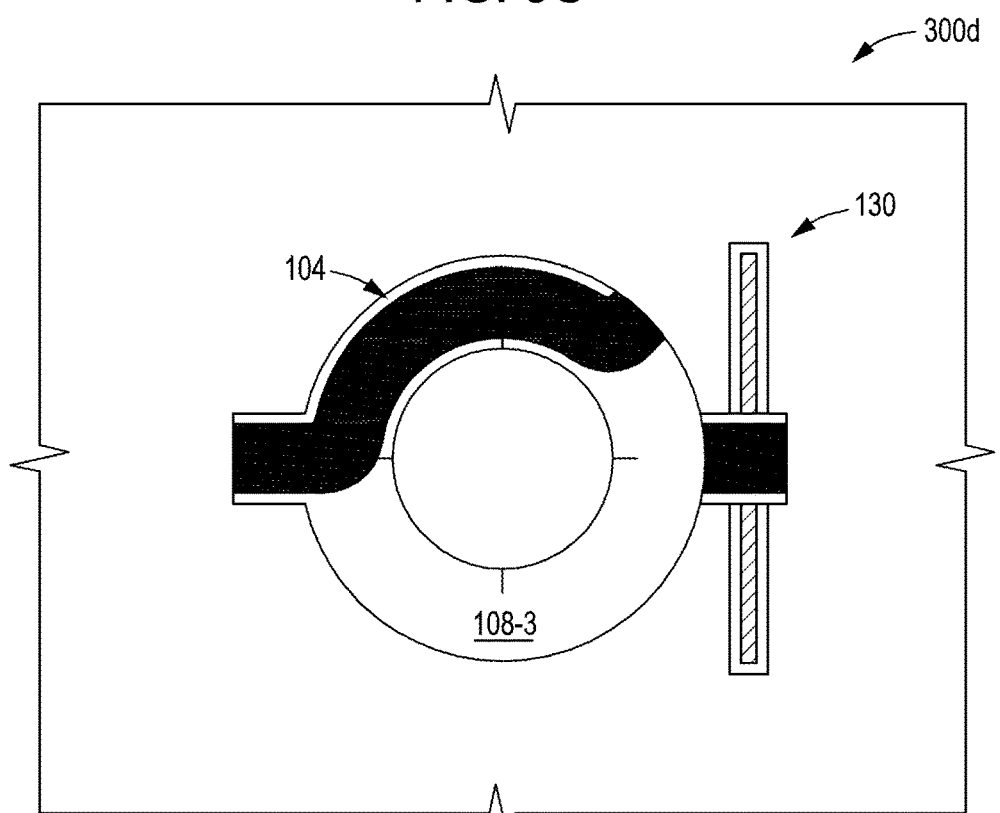

FIG. 3b depicts a bottom perspective view 300b of the winding assembly 100 with partial folds as described above with respect to FIG. 3a. FIG. 3c depicts a side perspective view 300c of the winding assembly 100 half-folded using the folding steps described above with respect to FIG. 3a. FIG. 3d depicts a plan view 300d of the winding assembly 100 (e.g., fully-folded). In the fully-folded winding assembly 100, the primary winding 104 and the secondary winding 204 are interleaved, resulting in low leakage inductance, and layer-to-layer connections are built into the pattern of the conductive films/traces and the folding thereof, eliminating the need for any conductive vias or other connections applied to the layers.

Further, as a result of the origami-like folding and calculated bend angles, the secondary winding achieves 15 turns of copper trace with only a single continuous piece of copper.

The fully-folded winding assembly 100 depicted in FIG. 3d can be used with any suitable planar transformer core having a suitably sized and shaped center post, such as E cores, PQ cores, RM cores, and pot cores, and the like. In other embodiments, the features of the winding assembly 100 may be sized and shaped to accommodate any desired planar transformer core shape.

Figure 4:
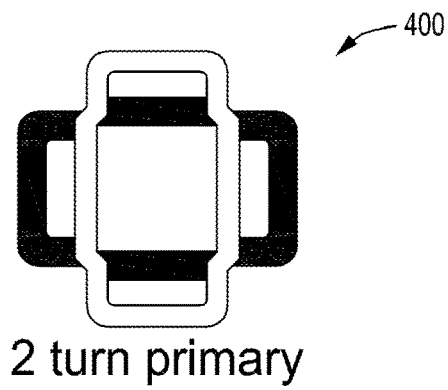
FIGS. 4, 5, and 6 depict expanded winding assemblies having different shapes in accordance with one or more embodiments of the present disclosure.
Figure 5:
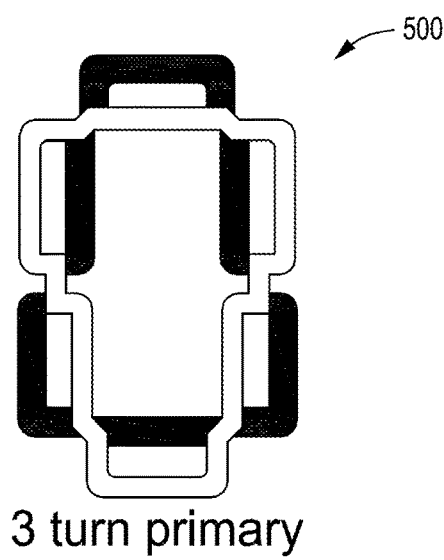
Figure 6:
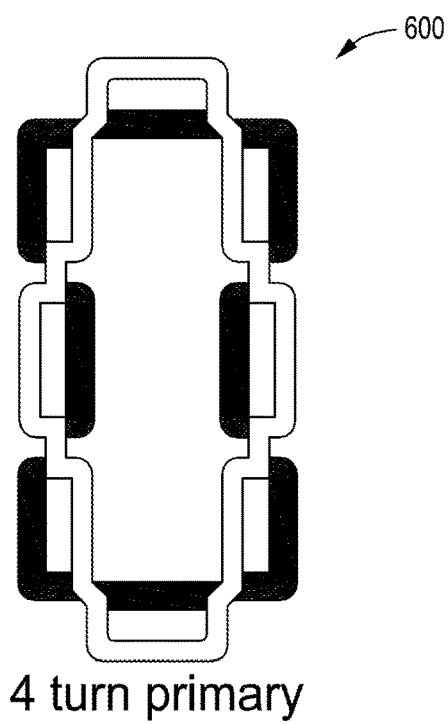

FIGS. 4, 5, and 6 depict expanded winding assemblies 400, 500, and 600, respectively, having different shapes in accordance with one or more embodiments of the present disclosure. The expanded winding assemblies 400, 500, and 600 are each sized and shaped for use with a planar transformer E-core, with respectively 2, 3, and 4 turns on the primary. For each of the winding assemblies 400, 500, and 600, the corresponding number of spiral "lanes" on the secondary will determine the final ratio for the fully-folded winding assembly.

Figure 7:
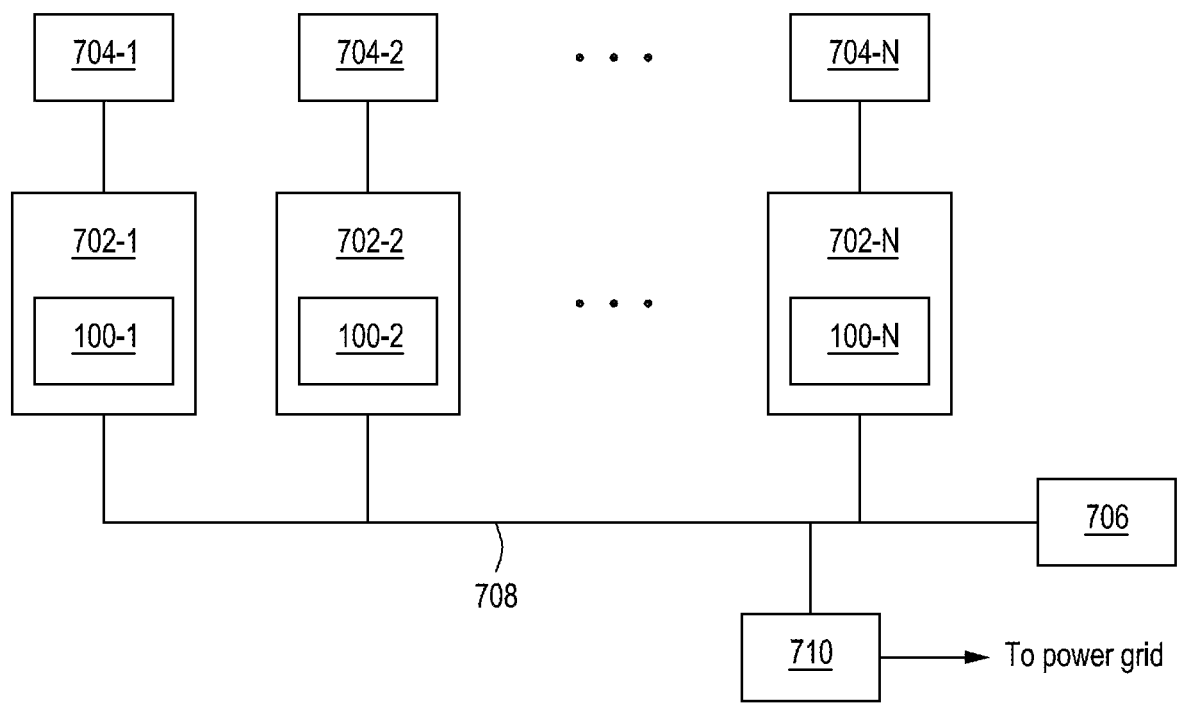
FIG. 7 is a block diagram of a system for power conversion using one or more embodiments of the present disclosure.

FIG. 7 is a block diagram of a system 700 for power conversion using one or more embodiments of the present disclosure. This diagram only portrays one variation of the myriad of possible system configurations and devices that may utilize the present disclosure. The present disclosure can be utilized in a variety of systems or devices that employ a planar transformer, such as certain power converters.

The system 700 comprises a plurality of power converters 702-1, 702-2 . . . 702-N, collectively referred to as power converters 702; a plurality of power sources 704-1, 704-2 . . . 704-N, collectively referred to as power sources 704; a controller 706 (e.g., a gateway); a bus 708; and a load center 710. The power sources 704 may be any suitable DC source, such as an output from a previous power conversion stage, a battery, a renewable energy source (e.g., a solar panel or photovoltaic (PV) module, a DC wind turbine generator, a rectified hydroelectric system, or similar renewable energy source), or the like, for providing DC power. In some embodiments, the power converters 702 may be bidirectional converters and one or more of the power sources 704 is an energy storage/delivery device that stores energy received from the corresponding power converter 702 and provides stored energy to the corresponding power converter 702.

Each power converter 702-1, 702-2 . . . 702-N is coupled to a power source 704-1, 704-2 . . . 704-N, respectively, in a one-to-one correspondence, although in some alternative embodiments, the power sources 704 may be coupled to a single power converter 702. The power converters 702 are coupled to the controller 706 via the bus 708.

The controller 706 is capable of communicating with the power converters 702 by wireless and/or wired communication techniques (e.g., power line communication) for providing operative control of the power converters 702. In some embodiments, the controller 706 may be a gateway that receives data (e.g., performance data) from the power converters 702 and communicates the data and/or other information to a remote device or system, such as a master controller (not shown). Additionally or alternatively, such a gateway may receive information from a remote device or system (not shown) and may communicate the information to the power converters 702 and/or use the information to generate control commands that are issued to the power converters 702. The power converters 702 are further coupled to the load center 710 via the bus 708.

The power converters 702 convert the DC power from the power sources 704 (e.g., DC power sources) to AC output and couple the generated AC power to the load center 710 via the bus 708. The generated power may then be distributed for use, for example to one or more appliances, and/or stored for later use, for example using batteries, heated water, hydro pumping, $H_2O$-to-hydrogen conversion, or the like. In some embodiments, the power converters 702 convert the DC input power to AC power that is commercial grid compliant and couple the AC power to a power grid via the load center 710. In some other embodiments, the power source 704 are AC sources (e.g., renewable AC sources such as AC wind turbine generators, hydroelectric sources, and the like) and the power converters 702 are AC:AC converters (e.g., cycloconverters) that receive an AC input from the power sources 704 (e.g., AC sources) and convert the input to an AC output. In still other embodiments, the power converters 702 may be AC:DC or DC:DC converters that generate DC output from received AC or DC power; in such embodiments the bus 708 is a DC bus and the generated DC is coupled to the bus 708 for distribution.

Each of the power converters 702 comprises a corresponding planar transformer having the winding assembly 100 for use in the power conversion performed. Each of the winding assemblies 100 within a corresponding power conditioner 702 allows the main power converter printed circuit board (PCB) to remain relatively simple at 4 thin layers, for the embodiment depicted in FIG. 1, while the complexity of multiple turns within the transformer can be achieved through the dedicated planar FCB.

While the foregoing is directed to embodiments of the present disclosure, other and further embodiments of the disclosure may be devised without departing from the basic scope thereof.

The invention claimed is:

1. A transformer winding assembly, comprising:
a primary winding configured to connect to an upper surface of a flexible substrate of the transformer winding assembly, the flexible surface comprising a plurality of conjoined annular rings, the primary winding runs along the plurality of conjoined annular rings in a first configuration; and
a secondary winding configured to connect to a lower surface of the flexible substrate, the secondary winding runs along the plurality of conjoined annular rings in a second configuration different from the first configuration,
wherein the primary winding comprises a first terminal end and a second terminal end applied to a second strip that connects two first annular rings of the plurality of conjoined annular rings, and
wherein the secondary winding comprises a first terminal end and a second terminal end applied to a first strip that connects two second annular rings of the plurality of conjoined annular rings.

2. The transformer winding assembly of claim 1, wherein each ring of the plurality of conjoined annular rings has the same diameter and a same sized center hole, such that the transformer winding assembly is configured for use with a corresponding planar transformer core comprising a cylindrical center post.

3. The transformer winding assembly of claim 1, wherein the primary winding is a continuous conductive film having a uniform thickness and width, and wherein the continuous conductive film is made from copper.

4. The transformer winding assembly of claim 1, wherein the secondary winding is a continuous conductive trace having a uniform thickness and width, and wherein the continuous conductive trace of is made from copper.

5. The transformer winding assembly of claim 1, wherein the primary winding and the secondary winding each run alternately in a clockwise/counter-clockwise direction along the plurality of conjoined annular rings.

6. The transformer winding assembly of claim 1, wherein the flexible substrate is a flexible circuit board that is foldable.

7. The transformer winding assembly of claim 1, wherein a second annular ring is conjoined with a first annular ring and a third annular ring along a second fold line and a third fold line, respectively.

8. The transformer winding assembly of claim 7, wherein a fifth annular ring is conjoined with a fourth annular ring and a sixth annular ring along a fifth fold line and a sixth fold line, respectively.

9. The transformer winding assembly of claim 8, wherein the first annular ring and the sixth annular ring are joined by the first strip, and a pair of tabs extend perpendicularly along the same plane as the first strip and 180° from one another.

10. The transformer winding assembly of claim 9, wherein the third annular ring and the fourth annular ring are joined by the second strip.

11. The transformer winding assembly of claim 10, wherein a first fold line and a fourth fold line run along a vertical axis through a center of the first strip and the second strip, respectively, and the vertical axis runs along the same plane as the flexible substrate.

12. A flexible substrate, comprising:
  a plurality of conjoined annular rings;
  an upper surface, a lower surface, and a plurality of fold lines configured to allow the flexible substrate to be folded therealong; and
  transformer winding assembly comprising:
    a primary winding connected to the upper surface and running along the plurality of conjoined annular rings in a first configuration; and
    a secondary winding connected to the lower surface and running along the plurality of conjoined annular rings in a second configuration different from the first configuration,
    wherein the primary winding comprises a first terminal end and a second terminal end applied to a second strip that connects two first annular rings of the plurality of conjoined annular rings, and
    wherein the secondary winding comprises a first terminal end and a second terminal end applied to a first strip that connects two second annular rings of the plurality of conjoined annular rings.

13. The flexible substrate of claim 12, wherein each ring of the plurality of conjoined annular rings has the same diameter and a same sized center hole, such that the transformer winding assembly is configured for use with a corresponding planar transformer core comprising a cylindrical center post.

14. The flexible substrate of claim 12, wherein the primary winding is a continuous conductive film having a uniform thickness and width, and wherein the continuous conductive film is made from copper.

15. The flexible substrate of claim 12, wherein the secondary winding is a continuous conductive trace having a uniform thickness and width, and wherein the continuous conductive trace of is made from copper.

16. The flexible substrate of claim 12, wherein the primary winding and the secondary winding each run alternately in a clockwise/counter-clockwise direction along the plurality of conjoined annular rings.

17. The flexible substrate of claim 12, wherein the flexible substrate is a flexible circuit board that is foldable.

18. The flexible substrate of claim 12, wherein a second annular ring is conjoined with a first annular ring and a third annular ring along a second fold line and a third fold line, respectively.

19. The flexible substrate of claim 18, wherein a fifth annular ring is conjoined with a fourth annular ring and a sixth annular ring along a fifth fold line and a sixth fold line, respectively.

20. A system for power conversion, comprising:
  a power converter comprising a flexible substrate, comprising:
    a plurality of conjoined annular rings;
    an upper surface, a lower surface, and a plurality of fold lines configured to allow the flexible substrate to be folded therealong; and
    a transformer winding assembly comprising:
      a primary winding connected to the upper surface and running along the plurality of conjoined annular rings in a first configuration;
      a secondary winding connected to the lower surface and running along the plurality of conjoined annular rings in a second configuration different from the first configuration,
      wherein the primary winding comprises a first terminal end and a second terminal end applied to a second strip that connects two first annular rings of the plurality of conjoined annular rings, and
      wherein the secondary winding comprises a first terminal end and a second terminal end applied to a first strip that connects two second annular rings of the plurality of conjoined annular rings; and
  a controller communicatively connected to the power converter for providing operative control of the power converter during power conversion.

* * * * *